(12) United States Patent
Zhang et al.

(10) Patent No.: US 10,354,697 B1
(45) Date of Patent: Jul. 16, 2019

(54) TOOL-LESS MOUNTING APPARATUS FOR HARD DISK DRIVE AND STORAGE DEVICE USING THE SAME

(71) Applicant: HONGFUJIN PRECISION ELECTRONICS (TIANJIN) CO.,LTD., Tianjin (CN)

(72) Inventors: Gong-Wen Zhang, Tianjin (CN); Han-Yu Li, New Taipei (TW); Yao-Yang Liu, Tianjin (CN); Ya-Ni Zhang, Tianjin (CN); Wen-Hu Lu, Tianjin (CN); Cheng-He Li, Tianjin (CN)

(73) Assignee: HONGFUJIN PRECISION ELECTRONICS(TIANJIN)CO.,LTD., Tianjin (CN)

( * ) Notice: Subject to any disclaimer, the term of this patent is extended or adjusted under 35 U.S.C. 154(b) by 55 days.

(21) Appl. No.: 15/965,816

(22) Filed: Apr. 27, 2018

(30) Foreign Application Priority Data

Jan. 31, 2018 (CN) .......................... 2018 1 0099783

(51) Int. Cl.
*H05K 5/02* (2006.01)
*F16B 2/10* (2006.01)
*G11B 33/02* (2006.01)

(52) U.S. Cl.
CPC .............. *G11B 33/022* (2013.01); *F16B 2/10* (2013.01); *H05K 5/023* (2013.01); *H05K 5/0217* (2013.01); *H05K 5/0226* (2013.01)

(58) Field of Classification Search
CPC .... G11B 33/022; G11B 33/124; H05K 5/023; H05K 7/1401; H05K 5/0217; H05K 5/0226; G06F 1/181; G06F 1/187; F16B 2/10

USPC ........... 361/679.33, 679.34, 679.37, 679.39; 248/220.21, 220.1, 274.1
See application file for complete search history.

(56) References Cited

U.S. PATENT DOCUMENTS

| | | | | |
|---|---|---|---|---|
| 5,777,845 A * | 7/1998 | Krum | ...................... | G11B 33/08 206/592 |
| 6,142,796 A * | 11/2000 | Behl | ....................... | G06F 1/181 361/679.33 |
| 6,337,793 B1 * | 1/2002 | Vier | ........................ | G06F 1/184 312/223.2 |
| 7,016,190 B1 * | 3/2006 | Chang | ...................... | G06F 1/184 235/381 |
| 8,749,966 B1 * | 6/2014 | Boudreau | ............... | G06F 1/187 361/679.33 |
| 9,052,878 B2 * | 6/2015 | Lo | ............................ | G06F 1/187 |
| 2009/0129009 A1 * | 5/2009 | Zhang | .................... | G11B 33/12 361/679.34 |

(Continued)

*Primary Examiner* — Abhishek M Rathod
(74) *Attorney, Agent, or Firm* — ScienBiziP, P.C.

(57) ABSTRACT

An apparatus for mounting hard disk drive and storage device without the use of tools includes a supporting base, a fixing arm, and a rotating arm parallel with the fixing arm. The fixing arm includes a fixing plate with an end fixed to the supporting base and first mounting pins perpendicularly connected to the fixing plate. The rotating arm includes a rotating plate with an end rotatably connected to the supporting base and second mounting pins are perpendicularly connected to the rotating plate. The rotating plate is rotatable between a closed and pin-aligned position, where the rotating plate is substantially parallel with the fixing plate, and an open position in which the mounting pins have been rotated out of alignment.

16 Claims, 5 Drawing Sheets

(56) References Cited

U.S. PATENT DOCUMENTS

2011/0096493 A1* 4/2011 Tye .................. G06F 1/187
                                                  361/679.33
2012/0236511 A1* 9/2012 Shu ................ G11B 33/124
                                                  361/748

* cited by examiner

TOOL-LESS MOUNTING APPARATUS FOR HARD DISK DRIVE AND STORAGE DEVICE USING THE SAME

FIELD

The subject matter herein generally relates to tool-less mounting apparatus for hard disk drive and storage devices using the mounting apparatus.

BACKGROUND

To meet increasing market demands for data storage capacity of servers, more storage devices are needed to be placed in a limited space to achieve the purpose of expanding storage capacity. Modular maintenance and rapid replacement are becoming more and more important, which requires fast and easy mountings for hard disk drives (HDDs).

BRIEF DESCRIPTION OF THE DRAWINGS

Implementations of the present disclosure will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 1:
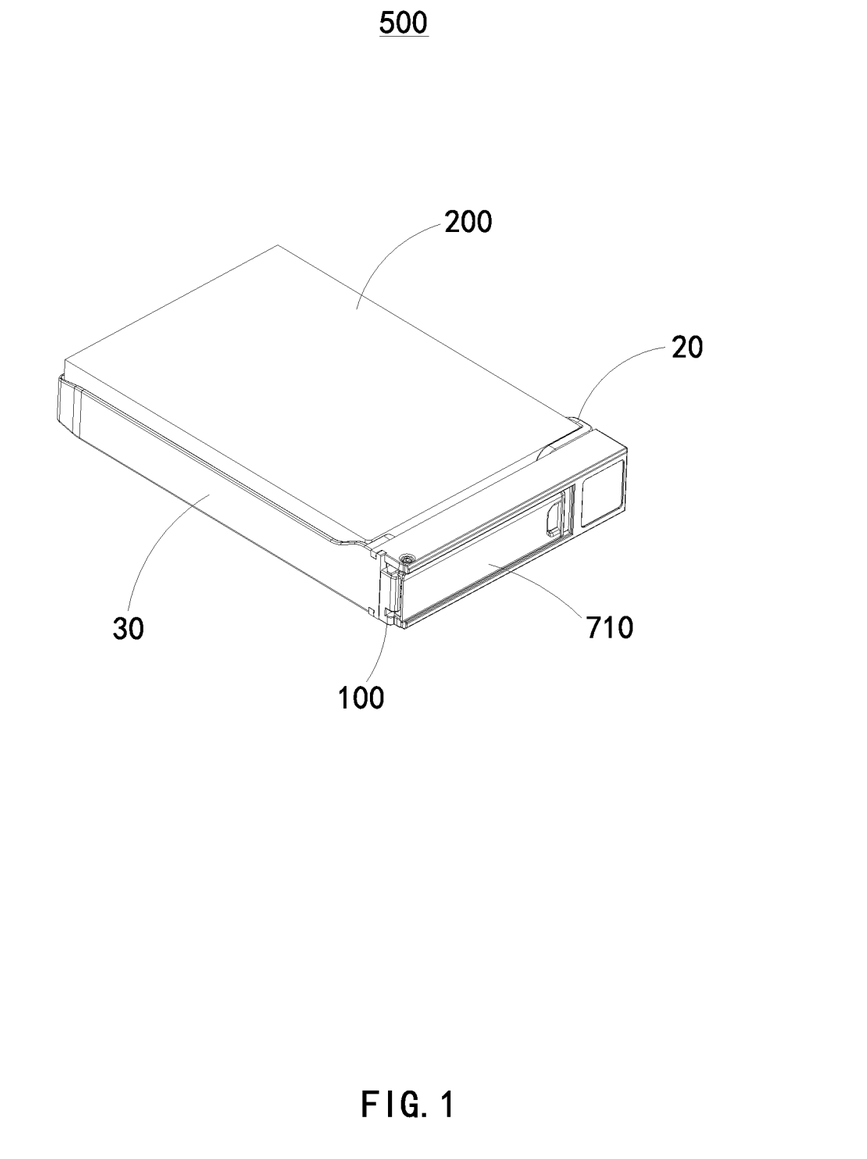
FIG. 1 illustrates an isometric view of an embodiment of a storage device.
Figure 4:
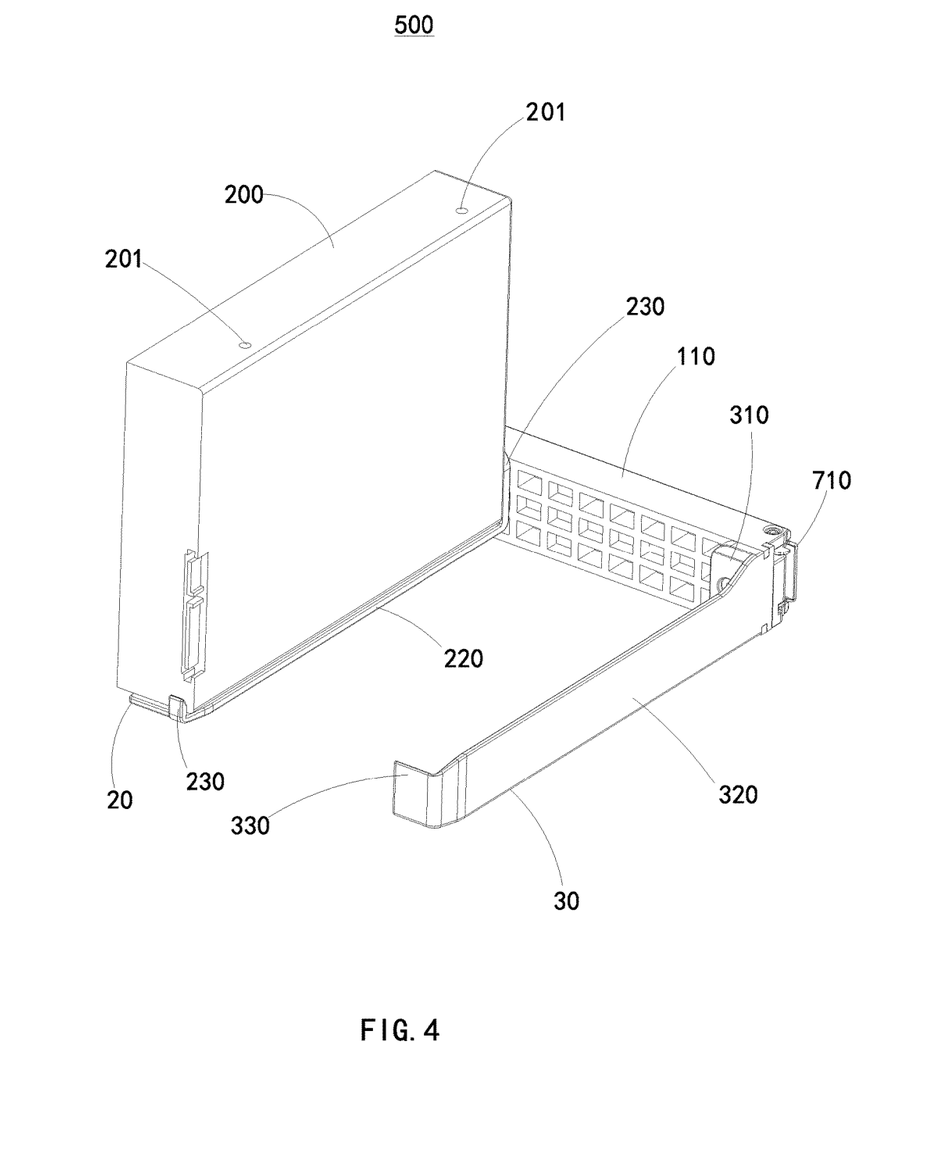
FIG. 4 illustrates an isometric view of the storage device of FIG. 1, showing the mounting apparatus in an open position.

FIGS. 1 and 4 illustrate a storage device 500. The storage device includes a hard disk drive 200 and a mounting apparatus 100 for mounting the hard disk drive 200.

Figure 2:
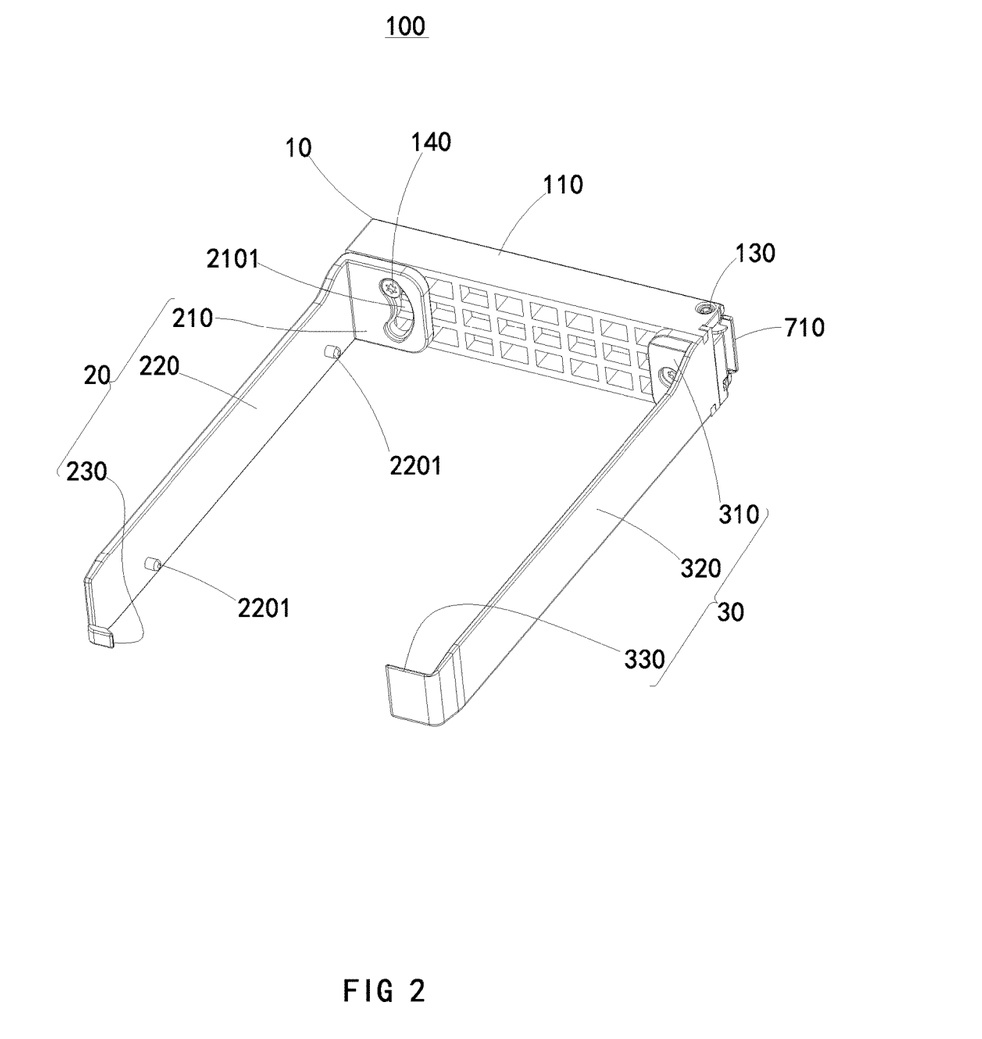
FIG. 2 illustrates an isometric view of the mounting apparatus of the storage device of FIG. 1, showing the mounting apparatus in a closed position.
Figure 3:
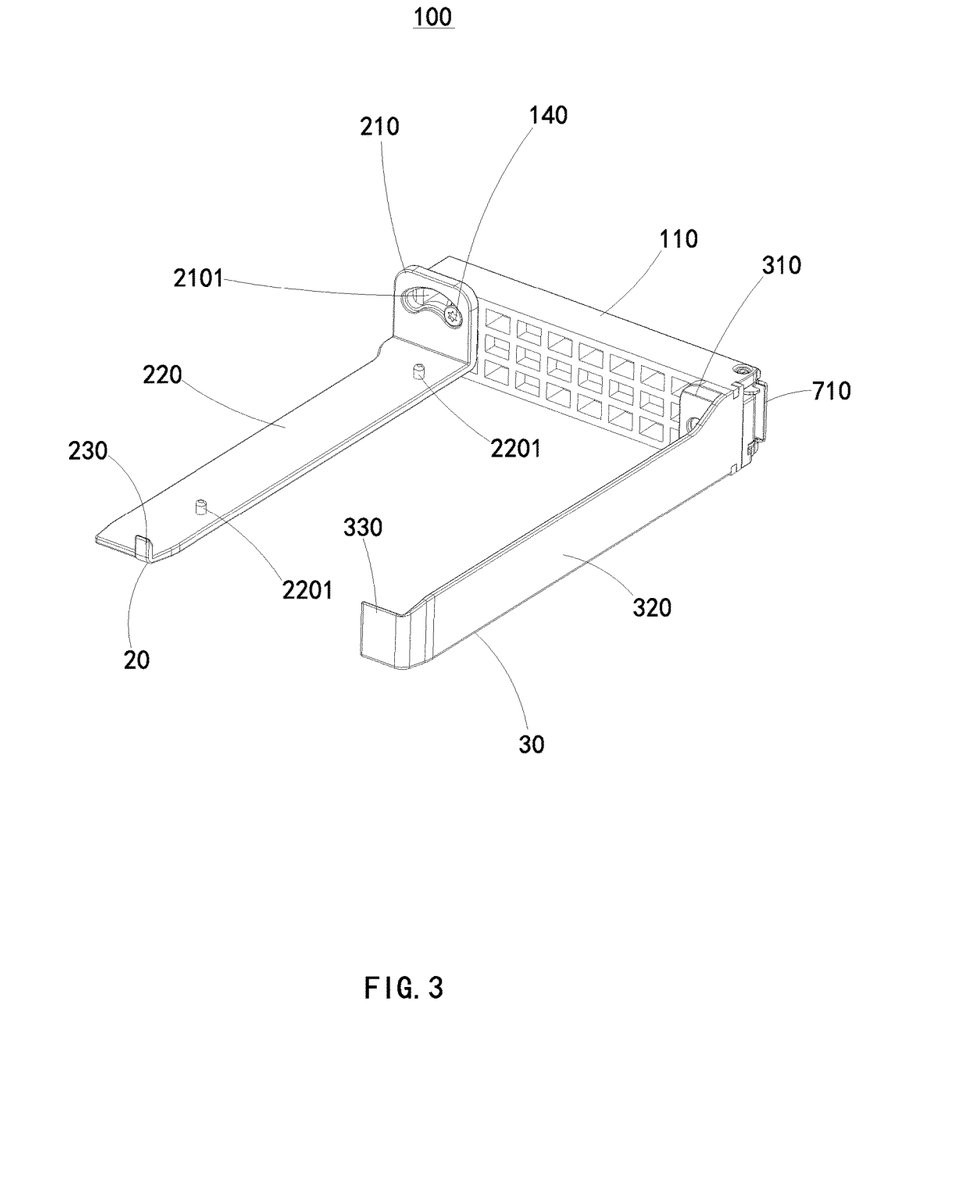
FIG. 3 illustrates an isometric view of the mounting apparatus of the storage device of FIG. 1, showing the mounting apparatus in an open position.
Figure 5:
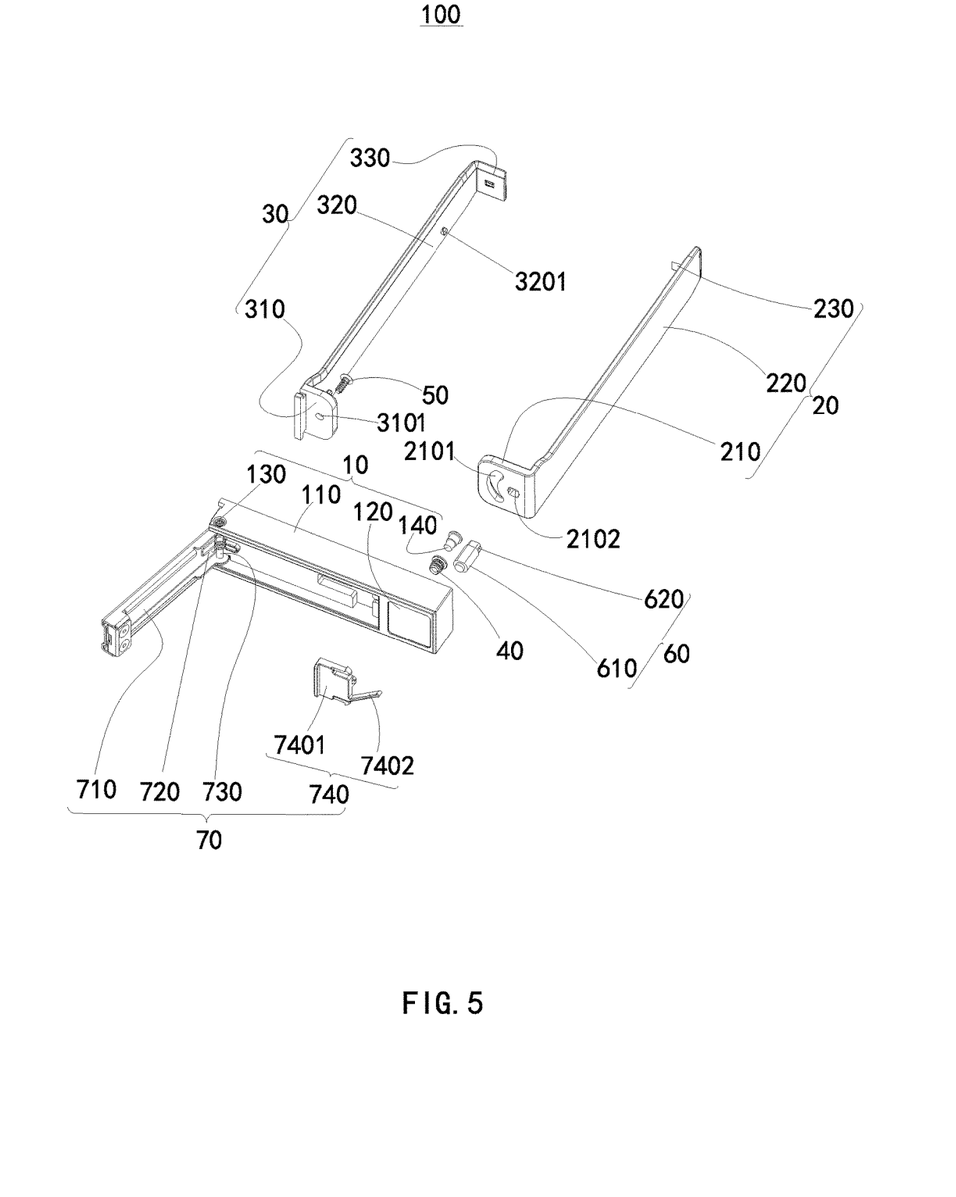
FIG. 5 illustrates an exploded view of the mounting apparatus of FIG. 2.

Referring also to FIGS. 2, 3 and 5, the mounting apparatus 100 includes a supporting base 10, a rotating arm 20, and a fixing arm 30.

The fixing arm 30 includes a fixing plate 320 and a plurality of first mounting pins 3201. The fixing plate 320 includes two opposing ends, one end of the fixing plate 320 being fixed to the supporting base 10. The first mounting pins 3201 are perpendicularly connected to the fixing plate 320.

The rotating arm 20 is parallel with the fixing arm 30. The rotating arm 20 includes a rotating plate 220 and a plurality of second mounting pins 2201. The rotating plate 220 includes two opposing ends, an end of the rotating plate 220 being rotatably connected to the supporting base 10. The second mounting pins 2201 are perpendicularly connected to the rotating plate 220.

Two opposing side surfaces of the hard disk drive 200 can each define mounting holes 201 to correspond to the first mounting pins 3201 and the second mounting pins 2201.

The fixing plate 320 and the rotating plate 220 together form a clamping apparatus for mounting the hard disk drive 200.

The rotating plate 220 is rotatable between a closed position (as shown in FIG. 2) and an open position (as shown in FIGS. 3 and 4).

When the rotating plate 220 rotates to the closed position, the rotating plate 220 is substantially parallel with the fixing plate 320, and the first mounting pins 3201 align with the second mounting pins 2201. The hard disk drive 200 is clamped by the fixing plate 320 and the rotating plate 220. The first mounting pins 3201 and the second mounting pins 2201 each intrude a mounting hole 201 on the two opposing side surfaces of the hard disk drive 200.

When the rotating plate 220 rotates to the open position, the plurality of first mounting pins 3201 deviates from and is non-aligned with the plurality of second mounting pins 2201, and the hard disk drive 200 can be removed.

In at least one embodiment, the mounting apparatus 100 can further include a hinge 60. An end of the rotating plate 220 is rotatably connected to the supporting base 10 through the hinge 60.

For example, the hinge 60 can include a fixing end 610 configured to be fixed to the supporting base 10 and a rotating end 620 joined with the fixing end 610. An end of the rotating plate 220 is mounted to the rotating end 620.

In at least one embodiment, the supporting base 10 includes a guiding pillar 140, and the rotating arm 20 defines a guiding slot 2101 corresponding to the guiding pillar 140. When the rotating plate 220 rotates between the closed position and the open position, the guiding pillar 140 slides along the guiding slot 2101.

It is understood that the guiding pillar 140 can also be included in the rotating arm 20, and the guiding slot can also be defined on the supporting base 10.

The rotating arm 20 can further include a first connecting plate 210 and a first latching portion 230.

The first connecting plate 210 is perpendicularly connected to an end of the rotating plate 220, and the first latching portion 230 is perpendicularly connected to the other end of the rotating plate 220.

The fixing arm can further include a second connecting plate 310 and a second latching portion 330.

The second connecting plate 310 is perpendicularly connected to an end of the fixing plate 320, and the second latching portion 330 is perpendicularly connected to the other end of the fixing plate 320.

The rotating plate 220 is rotatably connected to the supporting base 10 through the first connecting plate 210. The fixing plate 320 is fixed to the supporting base 10 through the second connecting plate 310.

The guiding slot 2101 can be defined on the first connecting plate 210. The guiding pillar 140 can include a threaded rod and a screw cap fixed to an end of the threaded rod. The other end of the threaded rod is fixed to the supporting base 10 after passing through the guiding slot 2101, the screw cap abuts the first connecting plate 210.

In at least one embodiment, the mounting apparatus 100 can further include an operating unit 70.

The operating unit 70 can include a handle 710 and a resilient clip 740 corresponding to the handle 710. The handle 710 is rotatably connected to the supporting base 10, and the resilient clip 740 is mounted to the supporting base 10.

The handle 710 is rotatable between an accommodating position (as shown in FIGS. 2-4) and a released position (as shown in FIG. 5). In the accommodating position, the handle 710 abuts the supporting base 10 and the resilient clip 740 is elastically deformed by resisting against a free end of the handle 710. In the released position, the resilient clip 740 releases the free end of the handle 710.

The supporting base 10 includes a chassis 110, and the chassis 110 defines an accommodating groove 120. The resilient clip 740 is slidably accommodated in the accommodating groove 120.

The resilient clip 740 can include a pushing block 7401 and a resisting arm 7402. An end of the resisting arm 7402 is fixed to the pushing block 7401.

When the handle 710 rotates to the accommodating position, the free end of the handle 710 resists against the pushing block 7401 and drives the pushing block 7401 to move. The resilient arm 7402 is elastically deformed, and the pushing block 7401 latches the handle 710 under restoring force of the resilient arm 7402.

The operating unit 70 can further include a pivot pin 730 and an elastic member 720 sandwiched between the handle 710 and the supporting base 10.

The supporting base 10 defines a pivot hole 130 corresponding to the pivot pin 730, and the handle 710 is rotatably connected to the supporting base 10 through the pivot pin 730 and the pivot hole 130.

When the handle 710 rotates to the accommodating position, the elastic member 720 is elastically deformed. When the resilient clip 740 is moved to release the free end of the handle 710, the handle 710 is driven to separate from the supporting base 10 under restoring force of the elastic member 720.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A tool-less mounting apparatus for hard disk drive, comprising:
   a supporting base;
   a fixing arm comprising:
      a fixing plate comprising two opposing ends, wherein an end of the fixing plate is fixed to the supporting base; and
      a plurality of first mounting pins perpendicularly connected to the fixing plate; and
   a rotating arm parallel with the fixing arm, comprising:
      a rotating plate comprising two opposing ends, an end of the rotating plate is rotatably connected to the supporting base;
      a plurality of second mounting pins perpendicularly connected to the rotating plate;
   wherein the fixing plate and the rotating plate define a clamping for mounting the hard disk drive, and the rotating plate is rotatable between a closed position, where the rotating plate is substantially parallel with the fixing plate and the plurality of first mounting pins align with the plurality of second mounting pins, and an open position, where the plurality of first mounting pins are deviated from the plurality of second mounting pins;
   wherein the mounting apparatus further comprises a hinge, an end of the rotating plate is rotatably connected to the supporting base through the hinge; and
   wherein the supporting base comprises a guiding pillar; the rotating arm defines a guiding slot corresponding to the guiding pillar; when the rotating plate rotates between a closed position and the open position, the guiding pillar slides along the guiding slot.

2. The mounting apparatus of claim 1, wherein the hinge comprises;
   a fixing end configured to be fixed to the supporting base; and
   a rotating end pin joint with the fixing end; wherein an end of the rotating plate is mounted to the rotating end.

3. The mounting apparatus of claim 1, wherein the rotating arm further comprises:
   a first connecting plate perpendicularly connected to an end of the rotating plate; and
   a first latching portion perpendicularly connected to the other end of the rotating plate;
   wherein the fixing arm further comprises:
   a second connecting plate perpendicularly connected to an end of the fixing plate; and
   a second latching portion perpendicularly connected to the other end of the fixing plate;
   wherein the rotating plate is rotatably connected to the supporting base through the first connecting plate; the fixing plate is fixed to the supporting base through the second connecting plate.

4. The mounting apparatus of claim 3, wherein the guiding slot is defined on the first connecting plate; the guiding pillar comprises a threaded rod and a screw cap fixed to an end of the threaded rod;
   wherein the other end of the threaded rod is fixed to the supporting base by passing through the guiding slot, the screw cap abuts the first connecting plate.

5. The mounting apparatus of claim 1, wherein the mounting apparatus further comprises an operating unit comprising:
   a handle rotatably connected to the supporting base; and
   a resilient clip corresponding to the handle and mounted to the supporting base;

wherein the handle is rotatable between an accommodated position, where the handle abuts the supporting base and the resilient clip is elastically deformed by resisting against a free end of the handle, and a released position, where the resilient clip releases the free end of the handle.

6. The sliding apparatus of claim 5, wherein the supporting base comprises a chassis, and the chassis defines an accommodating groove; the resilient clip is slidably accommodated in the accommodating groove.

7. The skiing apparatus of claim 6, wherein the resilient clip comprises: a pushing block; and
　a resisting arm, wherein an end of the resisting arm is fixed to the pushing block;
　when the handle rotates to the accommodated position, the free end of the handle resists against the pushing block and drives the pushing block to move, and the resilient arm is elastically deformed; the pushing block latches the handle under restoring force of the resilient arm.

8. The mounting apparatus of claim 7, wherein the operating unit further comprises:
　a pivot pin; and
　an elastic member sandwiched between the handle and the supporting base;
　wherein the supporting base defines a pivot hole corresponding to the pivot pin, and the handle is rotatably connected to the supporting base through the pivot pin and the pivot hole;
　when the handle rotates to the accommodated position, elastic member is elastically deformed; and when the resilient clip is moved to release the free end of the handle, the handle is driven to separate from the supporting base under restoring force of the elastic member.

9. A storage device comprising:
　a hard disk drive; and
　a mounting apparatus for the hard disk drive, comprising:
　　a supporting base;
　　a fixing arm comprising:
　　　a fixing plate comprising two opposing ends, wherein an end of the fixing plate is fixed to the supporting base; and
　　　a plurality of first mounting pins perpendicularly connected to the fixing plate; and
　　a rotating arm parallel with the fixing arm, comprising:
　　　a rotating plate comprising two opposing ends, an end of the rotating plate is rotatably connected to the supporting base;
　　　a plurality of second mounting pins perpendicularly connected to the rotating plate;
　　　wherein the fixing plate and the rotating plate define a clamping for mounting the hard disk drive, and the rotating plate is rotatable between a closed position, where the rotating plate is substantially parallel with the fixing plate and the plurality of first mounting pins align with the plurality of second mounting pins, and an open position, where the plurality of first mounting pins are deviated from the plurality of second mounting pins;
　　wherein the mounting apparatus further comprises a hinge, an end of the rotating plate is rotatably connected to the supporting base through the hinge;
　　wherein the supporting base comprises a guiding pillar; the rotating arm defines a guiding slot corresponding to the guiding pillar;

when the rotating plate rotates between the closed position and the open position, the guiding pillar slides along the guiding slot.

10. The storage device of claim 9, wherein the hinge comprises; a fixing end configured to be fixed to the supporting base; and a rotating end pin joint with the fixing end; wherein an end of the rotating plate is mounted to the rotating end.

11. The storage device of claim 9, wherein the rotating arm further comprises: a first connecting plate perpendicularly connected to an end of the rotating plate; and a first latching portion perpendicularly connected to the other end of the rotating plate; wherein the fixing arm further comprises: a second connecting plate perpendicularly connected to an end of the fixing plate; and a second latching portion perpendicularly connected to the other end of the fixing plate; wherein the rotating plate is rotatably connected to the supporting base through the first connecting plate; the fixing plate is fixed to the supporting base through the second connecting plate.

12. The storage device of claim 11, wherein the guiding slot is defined on the first connecting plate; the guiding pillar comprises a threaded rod and a screw cap fixed to an end of the threaded rod;
　wherein the other end of the threaded rod is fixed to the supporting base by passing through the guiding slot, the screw cap abuts the first connecting plate.

13. The storage device of claim 9, wherein the mounting apparatus further comprises an operating unit comprising:
　a handle rotatably connected to the supporting base; and
　a resilient clip corresponding to the handle and mounted to the supporting base;
　wherein the handle is rotatable between an accommodated position, where the handle abuts the supporting base and the resilient clip is elastically deformed by resisting against a free end of the handle, and a released position, where the resilient clip releases the free end of the handle.

14. The sliding apparatus of claim 13, wherein the supporting base comprises a chassis, and the chassis defines an accommodating groove; the resilient clip is slidably accommodated in the accommodating groove.

15. The sliding apparatus of claim 14, wherein the resilient clip comprises:
　a pushing block; and
　a resisting arm, wherein an end of the resisting arm is fixed to the pushing block;
　when the handle rotates to the accommodated position, the free end of the handle resists against the pushing block and drives the pushing block to move, and the resilient arm is elastically deformed; the pushing block latches the handle under restoring force of the resilient arm.

16. The storage device of claim 15, wherein the operating unit further comprises:
　a pivot pin; and
　an elastic member sandwiched between the handle and the supporting base;
　wherein the supporting base defines a pivot hole corresponding to the pivot pin, and the handle is rotatably connected to the supporting base through the pivot pin and the pivot hole;
　when the handle rotates to the accommodated position, elastic member is elastically deformed; and when the resilient clip is moved to release the free end of the handle, the handle is driven to separate from the supporting base under restoring force of the elastic member.

* * * * *